United States Patent
Ghneim et al.

[11] Patent Number: 5,805,013
[45] Date of Patent: Sep. 8, 1998

[54] NON-VOLATILE MEMORY DEVICE HAVING A FLOATING GATE WITH ENHANCED CHARGE RETENTION

[75] Inventors: Said N. Ghneim; H. Jim Fulford, Jr., both of Austin, Tex.

[73] Assignee: Advanced Micro Devices, Inc., Sunnyvale, Calif.

[21] Appl. No.: 815,835

[22] Filed: Mar. 12, 1997

Related U.S. Application Data

[62] Division of Ser. No. 393,138, Feb. 21, 1995.

[51] Int. Cl.$^6$ .......................... H01L 21/3205; H01L 23/58
[52] U.S. Cl. ............................................. 257/411; 257/321
[58] Field of Search .................................. 257/315, 316, 257/321, 325, 410, 412, 411

[56] References Cited

U.S. PATENT DOCUMENTS

| | | | |
|---|---|---|---|
| 4,422,161 | 12/1983 | Kressel et al. | 365/185.09 |
| 4,581,622 | 4/1986 | Takasaki et al. | |
| 4,958,321 | 9/1990 | Chang | 365/185.03 |
| 4,999,812 | 3/1991 | Amin | 365/185.12 |
| 5,070,032 | 12/1991 | Yuan et al. | 437/43 |
| 5,077,691 | 12/1991 | Haddad et al. | 365/185.22 |
| 5,101,250 | 3/1992 | Arima et al. | 365/183.12 |
| 5,120,671 | 6/1992 | Tang et al. | 437/43 |
| 5,120,672 | 6/1992 | Mitchell et al. | 437/43 |
| 5,147,811 | 9/1992 | Sakagami | 437/35 |
| 5,149,666 | 9/1992 | Mikata et al. | 437/43 |
| 5,151,375 | 9/1992 | Kazerounian et al. | 437/43 |
| 5,208,175 | 5/1993 | Choi et al. | 437/43 |
| 5,279,981 | 1/1994 | Fukatsu et al. | |
| 5,279,982 | 1/1994 | Crotti | 437/48 |
| 5,284,786 | 2/1994 | Sethi | 437/43 |
| 5,335,198 | 8/1994 | Van Buskirk et al. | 365/185.3 |
| 5,364,664 | 11/1994 | Tsubouchi et al. | 427/535 |
| 5,462,898 | 10/1995 | Chen et al. | |
| 5,508,543 | 4/1996 | Hartstein et al. | 257/315 |
| 5,545,906 | 8/1996 | Ogura et al. | 257/315 |
| 5,625,212 | 4/1997 | Fukumoto | 257/315 |
| 5,641,989 | 6/1997 | Tomioka | 257/315 |
| 5,644,158 | 7/1997 | Fujii et al. | 257/532 |
| 5,652,447 | 7/1997 | Chen et al. | 257/315 |

OTHER PUBLICATIONS

Hisamune, "A 3.6 Fm$^2$ Memory Cell Structure for 16MB EPROMS", IEEE, 1989, pp. 25.2.1–25.2.4.

Bellezza, "A New Self–Aligned Field Oxide Cell for Multimegabit EPROMS", IEEE, 1989, pp. 25.1.1–25.1.4.

Woo, "A Novel Memory Cell Using Flash Array Contactless EPROM (FACE) Technology", IEEE, 1990, pp. 5.1.–5.1.4.

Robinson, "Endurance Brightens the Future of Flash: Flash memory as a viable mass–storage alternative", *Technnological Horizons*, Nov., (Chilton Company, 1988), pp. 167–169.

(List continued on next page.)

*Primary Examiner*—Donald Monin
*Attorney, Agent, or Firm*—Kevin L. Daffer; Conley, Rose & Tayon

[57] ABSTRACT

A non-volatile memory device is fabricated having enhanced charge retention capability. Enhanced charge retention is achieved upon the floating gate of the non-volatile memory device. The floating gate can be configured as a stacked or non-stacked pair of polysilicon conductors. In either instance, negative charge programmed upon the floating gate is retained by reducing the presence of positively charged atoms within dielectrics overlying the floating gate conductor. Moreover, diffusion avenues of the positively charged hydrogen are reduced by maintaining a prevalence of relatively strong bond locations within the overlying dielectric layers. Thus, origination of positively charged atoms such as hydrogen from those bonds is substantially prevented by processing the hydrogen-containing dielectrics at relatively low temperatures and further processing any subsequent dielectrics and/or conductors overlying the floating gate at relatively low temperatures. Suitable processing temperatures (dielectric deposition and metal sintering temperatures) are temperatures less than 380° C.

9 Claims, 5 Drawing Sheets

OTHER PUBLICATIONS

Lai, "Comparison and Trends in Today's dominant $E^2$ Technologies", *IEDM Tech. Dig.*, 1986, pp. 580–583.

Ghandhi, *VLSI Fabrication Principles: Silicon and Gallium Arsenide*, (John Wiley & Sons, 1983), pp. 465–470.

Wolf, *Silicon Processing for the VLSI ERA*, vol. 1: *Process Technology*, (Lattice Press, 1986), pp. 198–201.

Patent Abstract of Japan, Publication Number 6–1170067, Publication Date Jul. 31, 1986.

Niwano, M., et al., "Ultraviolet–Induced Deposition of SIO2 Film From Tetraethoxysilane Spin–Coated on SI", Journal of the Electrochemical Society, vol. 141, No. 6, Jun. 1, 1994, pp. 1556–1561.

Hieber, K., et al., "Chemical Vapour Deposition of Oxide and Metal Films for VLSI Applications," vol. 181, No. 1, Dec. 10, 1989, pp. 75–84.

Ueno, T., et al., "Deposition of Low Hydrogen Content Silicon Nitride Film Using High–Intensity Vacuum Ultra-violet Light Source in Windowless Photochemical Vapor Deposition Reactor," vol. 31, No. 12A, Part 01, Dec. 1, 1992, pp. 3972–3975.

Wolf, "Silicon Processing for the VLSI ERA," vol. 1, 1986, pp. 182–195.

Wolf, "Silicon Processing for the VLSI ERA," vol. 2, 1990, pp. 273–276, 361–363.

NON-VOLATILE MEMORY DEVICE HAVING A FLOATING GATE WITH ENHANCED CHARGE RETENTION

This is a Division of application Ser. No. 08/393,138, filed Feb. 21, 1995.

BACKGROUND OF THE INVENTION

1. Field of the Invention

This invention relates to an integrated circuit and more particularly to a non-volatile memory device with enhanced charge retention, and a method for making same.

2. Description of the Relevant Art

There are many types of non-volatile memory, often called read only memory (ROM) or programmable read only memory (PROM). Non-volatile PROM memory can be formed in either bipolar or MOS technology. Most MOS PROMs are typically made using one of three currently available technologies (EPROM, EEPROM, or flash EEPROM).

MOS PROMs are designed to perform in numerous similar ways, and can be achieved using many well-known technologies, examples of which are: (i) floating gate tunnel oxide, (ii) textured poly, (iii) metal nitride oxide silicon (MNOS), and (iv) EPROM tunnel oxide (ETOX). Program and erase of an EPROM or EEPROM cell differs depending upon which technology is used. For example, a floating gate tunnel oxide EPROM transistor is programmed (moving electrons into the floating gate) by biasing the control gate, while erasure (moving electrons out of the floating gate) is achieved by biasing the drain. Programming a textured poly-type EPROM device is achieved by electrons tunneling from a first polysilicon into a second polysilicon, wherein erase is achieved by electrons tunneling from the second polysilicon to a third polysilicon. MNOS-type devices allow charge to be stored in discrete traps in the bulk of the nitride. A comparison of floating gate tunnel oxide, textured poly, NMOS technologies and the program and erase thereof is described in S. Lai et al., "Comparison and Trends in Today's Dominant $E^2$ Technologies", *Int'l Electron Devices Meeting Tech. Digest,* (1986) pp. 580-583 (herein incorporated by reference).

According to conventional operation, non-volatile PROM memory devices are "programmed" by inducing electron injection to the floating gate. Electron injection carries a negative charge and places that charge on the floating gate. After sufficient negative charge accumulates on the floating gate, the negative potential of the floating gate raises the threshold voltage of the associated field effect transistor (FET) and inhibits current flow through the channel during a subsequent "read" mode. There are numerous ways in which to move electrons to or from the floating gate. The electrons can be electrically drawn or, alternatively, the electrons can be drawn using ultraviolet radiation. In either instance, the resulting non-volatile PROM memory is programmed by electron accumulation on the floating gate and threshold adjust of the resulting device. The mechanism by which electrons are injected onto the floating gate during a program cycle and subsequently drawn from the floating gate in an erase cycle is more fully explained in reference to U.S. Pat. No. 5,077,691 (herein incorporated by reference).

There are many types of non-volatile memory devices. As described herein, "non-volatile memory" includes any PROM device having a floating gate adapted for receiving electrons during a program cycle. Presently, floating gates are found in EEPROMs, EPROMs and flash EPROMs. FIG. 1 illustrates a non-volatile memory device 10a, shown as a flash EPROM device. Memory 10a is illustrative of a single transistor memory cell typically connected within an array of cells formed on a semiconductor substrate. Device 10a is shown having a drain 12 and a double-diffused source 14 formed within a p-type substrate 16. Device 10a is programmed by drawing electrons from drain 12, through tunnel oxide 18 and into floating gate 20. Tunnel oxide 18 is relatively thin to allow traverse of hot electrons during the program or erase cycle. To allow flash or bulk erase, source 14 is connected common throughout the array. A dielectric 22 is shown interposed between floating gate 20 and a control gate 24, wherein control gate 24 is generally connected to a word line and drain 12 is generally connected to a bit line.

Another conventional form of a single cell memory device 10b is shown in FIG. 2. Device 10b includes source and drain regions 26 and 28 provided within substrate 30. Tunnel oxide layer 32 is provided on the surface of substrate 30 under a floating gate 34. Floating gate 34 overlaps a portion of drain 28 and a portion of a channel formed between source 26 and drain 28. A dielectric 36 separates floating gate 34 from control gate 38. The device structure 10b functions as a two transistor set; one transistor is the floating gate memory transistor and the other transistor is a series-connected enhancement transistor controlled by control gate 38.

Single cell memory devices 10a and 10b are but two exemplary forms of a non-volatile memory cell. There are numerous other forms used for storing electrons programmed upon a floating gate. FIG. 3 illustrates yet another exemplary form. Instead of stacking a control gate upon a floating gate, FIG. 3 illustrates a memory device or cell 10c having non-stacked floating and control gates. Specifically, FIG. 3 illustrates a single cell memory device 10c having a floating gate 40 laterally displaced from control gate 42. Memory device 10c thereby indicates a single memory cell having three transistors: a program transistor Q1, a sense transistor Q2 and a read transistor Q3. A tunnel oxide 44 is formed between floating gate 40 and a drain side 43 of program transistor Q1. Electrons are thereby injected onto floating gate 40 by activation of program transistor Q1. Floating gate 40 can therefore be programmed with injected electrons which control activation of sense transistor Q2 in accordance with the quantity of electrons injected upon the floating gate 40. The conventional forms shown in FIGS. 1–3 are each illustrative of a floating gate 20, 34 and 40. A respective control gate 24, 38 and 42 may or may not cause turn-on of the transistor associated with the floating gate depending upon whether the floating gate is programmed or not.

It is important when programming a non-volatile PROM memory device that, once programmed, the memory device remains programmed until it is subsequently erased. The programmed state must remain regardless of the programmed duration. In many applications the non-volatile memory must remain programmed for many years. During the programmed state, it is imperative that the electrons remain trapped upon the floating gate and not be allowed to leak off the floating gate or become neutralized by ingress of positively charged atoms from surrounding structures. It is the latter instance to which this disclosure is focused. That is, this application addresses the "charge loss phenomena" caused by neutralization of electrons programmed upon a floating gate. Charge loss generally occurs due to migration of positively charged atoms from surrounding source materials. Through experimentation by the present applicants, it appears the positively charged atoms are sourced primarily from surrounding dielectrics. Electron charge loss presents itself whenever the dielectrics are formed or whenever the dielectrics undergo heat cycles after formation. The present applicants have discovered that heat cycles cause a disruption of atomic bonds within dielectric materials overlying and surrounding the floating gate. The bond disruption thereby frees positively charged atoms from the overlying structures and makes those atoms available for attraction to a programmed, negatively charged floating gate. The result of that attraction is the neutralization of the programmed charge—i.e., charge loss of the programmed device.

SUMMARY OF THE INVENTION

The problems outlined above are in large part solved by the fabrication process of the present invention. That is, the present process is presented to form a non-volatile memory device or cell which is less susceptible to the charge loss phenomena. The process hereof is designed to make less available positively charged atoms within the dielectric structures which surround a floating gate. Each dielectric which resides above and about a floating gate, or above and about a stacked pair of floating and control gates, is carefully processed such that positively charged atoms are not formed within those dielectrics either during the fabrication process or after fabrication is complete and the device is field operable.

It appears that elemental hydrogen present in the structure of certain dielectrics is the primary source of positively charged atoms within a non-volatile memory device topography. The hydrogen atoms arise from the chemical composition of hydrogen-bearing dielectric layers residing above or around the floating gate. Through experimentation, the present applicants determined that the hydrogen atoms are released from their bonding sites whenever they are subjected to temperatures exceeding a critical level. For that reason, the present fabrication process is designed to reduce the disruption of hydrogen from its bond site and thereby reduce the availability of positively charged hydrogen atoms within the overlying dielectric layers. The availability of positively charged hydrogen atoms is minimized by (i) reducing temperatures used in the formation of hydrogen-containing dielectrics, (ii) reducing temperatures used in the formation of dielectrics and conductors subsequent to the deposition of hydrogen-containing dielectrics and (iii) reducing post dielectric/conductor formation temperatures (i.e., reducing sintering, alloying and annealing temperatures). Experimentation has determined the critical temperature over which predominant amounts of positively charged hydrogen appear is approximately 380° C. Thus, hydrogen-containing dielectrics as well as subsequent dielectrics/conductors are formed at temperatures less than 380° C. in most instances and less than 350° C. in other instances.

By using a reduced temperature at critical fabrication steps, the various layers overlying the floating gate do not produce substantial amounts of positively charged, free atomic hydrogen. Absent large amounts of atomic hydrogen residing within the overlying dielectric regions, fewer positively charged source atoms which can deleteriously neutralize a programmed, negatively charged floating gate are present. That is, reduction in the availability of positively charged atomic hydrogen is experimentally shown to equate with a reduction in problems associated with the charge loss phenomenon.

It is contemplated that numerous dielectric layers are formed with hydrogen contained therein. The hydrogen is typically bonded within, for example, a Si—H, N—H and/or Si—OH structure within one or more dielectrics overlying the floating gate. The dielectrics reside directly on top of or a spaced distance above a floating gate. The floating gate can be configured absent a control gate stacked thereover, or the floating gate can be formed as a lower conductor spaced below a control gate. In the latter instance, the dielectrics are generally formed above both the floating gate as well as the control gate. In either instance, the dielectrics are formed using fabrication techniques of chemical vapor deposition (CVD) or spin-on techniques. CVD and spin-on application of dielectrics often utilize a hydrogen base material or carrier material which bonds within the resulting dielectric layer or layers. It is postulated that the Si—H bonds are broken at lower temperatures than the N—H bonds or the Si—OH bonds. It is therefore desirable that whatever bonds are formed in the dielectric, those bonds be strong bonds and not easily broken. Preferably, a prevalent amount of those bonds should be N—H or Si—OH bonds rather than Si—H bonds.

It is believed that hydrogen is used to form a passivation layer typically located at the uppermost layer of the semiconductor topography. Hydrogen is also present in the spin-on dielectric materials located between the floating (or control gate) and the passivation layer. A popular spin-on dielectric material comprises siloxanes or silicates mixed in an alcohol-based solvent. Hydrogen sourced from the oxynitride passivation layer or the SOG layer can cause deleterious charge loss upon a programmed floating gate absent low temperature processing of the present invention. By minimizing the temperature at which passivation and SOG layers are formed, or any hydrogen-containing dielectric is formed, positively charged atoms are made less available for migration to and neutralization of electrons upon a programmed floating gate.

Broadly speaking the present invention contemplates a method for fabricating a non-volatile PROM memory device. The method comprises the steps of growing a tunnel oxide upon a semiconductor substrate. Thereafter, a floating gate (floating conductor) is patterned upon the tunnel oxide. A temperature less than 380° C. is then used to form, at an elevational level above the floating conductor, a hydrogen-containing dielectric layer. Thereafter, a combination of dielectric and conductive layers are formed at temperatures less than 380° C. upon the hydrogen-containing dielectric layer. The hydrogen-containing dielectric layer is either deposited upon a floating conductor or is deposited a spaced distance above the floating conductor. Moreover, the hydrogen-containing dielectric layer can be formed upon a control gate (control conductor) or formed a spaced distance above the control conductor. As defined herein, "control conductor" includes a conductor insulatively spaced above or laterally from the floating conductor. The control conductor and floating conductor are each made of polycrystalline silicon or polysilicon.

The present invention further contemplates a method for fabricating a memory device having a floating gate. The method includes the steps of providing a semiconductor substrate upon which a tunnel oxide is formed. Thereafter, a floating gate is deposited upon the tunnel oxide and an intermediate oxide is formed upon the floating gate. A control gate is thereafter deposited upon the intermediate oxide and, at an elevation level above the control gate, a hydrogen-containing dielectric is deposited. The hydrogen-containing dielectric includes bonded hydrogen which remains in its bonded location during formation of the dielectric. Moreover, the hydrogen remains bonded during times in which the previously formed dielectric is exposed to heat cycles—i.e., metal alloy/sintering heat cycles, etc.

The present invention contemplates a method for fabricating a memory device having a floating gate. The method includes the steps of providing a semiconductor substrate upon which a tunnel oxide is formed. A floating gate is thereafter deposited upon the tunnel oxide and, at an elevation level above the floating gate, a hydrogen-containing dielectric is deposited. The hydrogen-containing dielectric includes bonded hydrogen which remains in its bonded location during formation of the dielectric and during times in which the dielectric is exposed to heat cycles which occur after dielectric fabrication. The heat cycles include fabrication heat cycles, metal alloy heat cycles or heat cycles associated with memory device operation in the field.

The present invention further contemplates a non-volatile memory cell. The memory cell includes a semiconductor substrate containing impurity implant regions and a tunnel oxide placed upon the substrate. A polysilicon strip is placed upon the tunnel oxide. The polysilicon strip is adapted to receive electrons injected from one of the impurity implant regions during the program cycle of the memory cell. A dielectric comprising hydrogen is formed above the polysilicon strip. The dielectric is formed at a temperature less than 380° C. to minimize formation and movement of free atomic hydrogen from the dielectric to the electrons injected upon the polysilicon strip. It is contemplated that hydrogen remains in its bonded location when the hydrogen-containing dielectric is exposed to ambient temperatures less than 400° C.

BRIEF DESCRIPTION OF TEE DRAWINGS

Other objects and advantages of the invention will become apparent upon reading the following detailed description and upon reference to the accompanying drawings in which.

Figure 1:
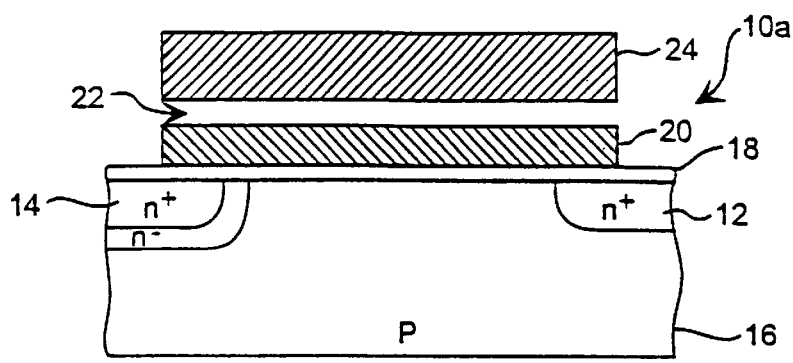
FIG. 1 is a partial, cross-sectional view of a conventional memory cell having a stacked pair of floating and control conductors.
Figure 2:
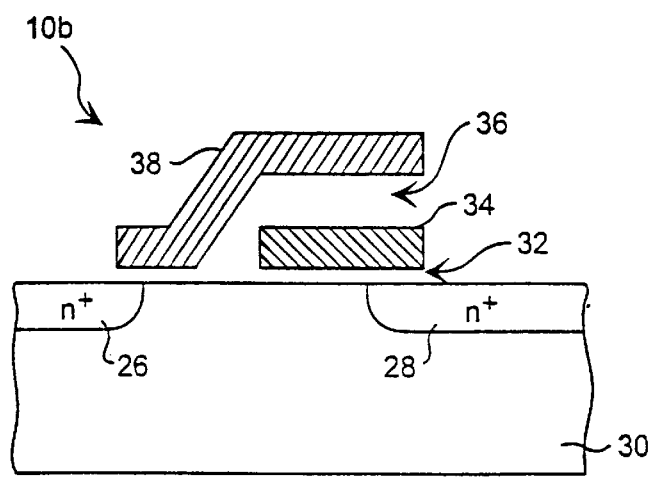
FIG. 2 is a partial, cross-sectional view of another conventional memory cell having partially overlapping floating and control conductors coupled to form a series-connected pair of transistors.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
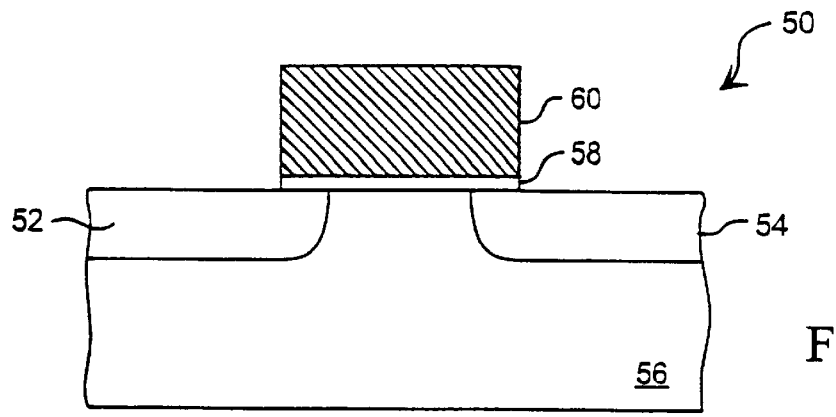
FIG. 4 is a partial, cross-sectional view of a memory cell formed at an early stage of fabrication according to the present invention.

Turning now to the drawings, FIG. 4 illustrates a single cell, non-volatile PROM memory device 50 formed at an early stage of development. Memory device 50 includes source and drain regions 52 and 54 placed within a semiconductor substrate 56. Substrate 56 is a p-type single crystal silicon substrate, wherein source and drain regions 52 and 54, respectively, are of n-type impurity. Memory device 50 includes any memory configuration having a floating gate insulatively spaced upon the upper surface of substrate 56. Thus, memory device 50 includes an EEPROM, an EPROM and/or a flash EPROM.

Grown upon the upper surface of substrate 56 is a thin oxide 58, generally less than 100 Angstroms. At least a portion of oxide 58 comprises a tunnel region through which electrons can tunnel to and from an overlying floating conductor 60. Floating conductor 60 is made of polysilicon. Oxide 58 is $SiO_2$ thermally grown in an oxygen-containing dry ambient. It is understood that floating conductor 60 can be the lower conductor in a stacked pair of floating and control conductors. Alternatively, floating conductor 60 can be configured in a non-stacked arrangement, wherein floating conductor 60 is laterally spaced from a control conductor. It is further understood that in either arrangement (stacked or non-stacked) at least one dielectric layer is formed above floating conductor 60. Thus, FIG. 4 illustrates a generic floating conductor. A control conductor can be either formed above the floating conductor or laterally spaced from the floating conductor.

Figure 5:
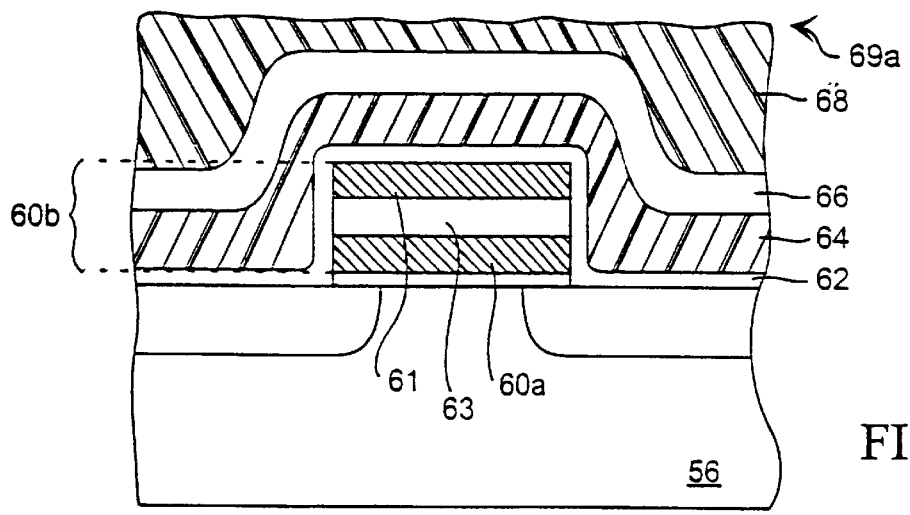
FIGS. 5–7 are partial, cross-sectional views of the memory cell of FIG. 4 formed at successive stages of fabrication according to the present invention.

FIG. 5 is presented to clarify the various configurations of floating conductor 60, shown in FIG. 4, FIG. 5 illustrates floating conductor 60b represented in a non-stacked configuration absent an overlying control conductor. Alternatively, floating conductor 60a can be represented in a stacked configuration with control conductor 61 insulatively spaced thereover. It is understood that, in a stacked configuration, floating conductor 60a illustrated in FIG. 5 can be the lower conductor 60a of a stacked arrangement of floating conductor 60a and control conductor 61. In the non-stacked arrangement, floating conductor 60b comprises the entire conductive element (absent an intervening oxide spacer 63).

Regardless of whether the floating conductor or the control conductor is the uppermost conductive element, a series of dielectric layers 62–68 is configured upon the conductor elements. Each dielectric layer consists of a material which permits the passage of electromagnetic field but does not conduct a substantial amount of current. Layer 62 can suitably be formed as an oxide within a CVD chamber. Layer 62 can be formed either in atmospheric or low pressure conditions (i.e., as an APCVD or LPCVD oxide). Layer 64 is suitably formed as a borophosphosilicate glass (BPSG). BPSG is preferably formed in an LPCVD chamber and reflowed in a nitrogen ($N_2$) ambient or oxygen ($O_2$) ambient instead of a hydrogen-bearing steam ambient. Reflow occurs at a temperature between 700° C. and 900° C.

Reflow allows a gradual contour at locations 65. One advantage of reflow is improved step coverage for subsequently placed dielectrics/conductors. Layer 66 is suitably formed within a plasma enhanced CVD chamber (PECVD chamber). RF-induced glow discharge transfers energy into the silicon-based reactant gases, thereby allowing substrate 56 to remain at a lower temperature than in counterpart APCVD or LPCVD processes. PECVD can be carried forth using, for example, parallel plate reactors or horizontal tube reactors. Layer 68 is suitably formed as a spin-on glass (SOG). SOG is preferably formed from a siloxane-based material and is applied in liquid form. After application, SOG is cured to exhibit planarization capabilities similar to those of polyimide films. SOG is chosen to fill voids or valleys thereby leaving a substantially planar upper surface 69a.

Figure 6:
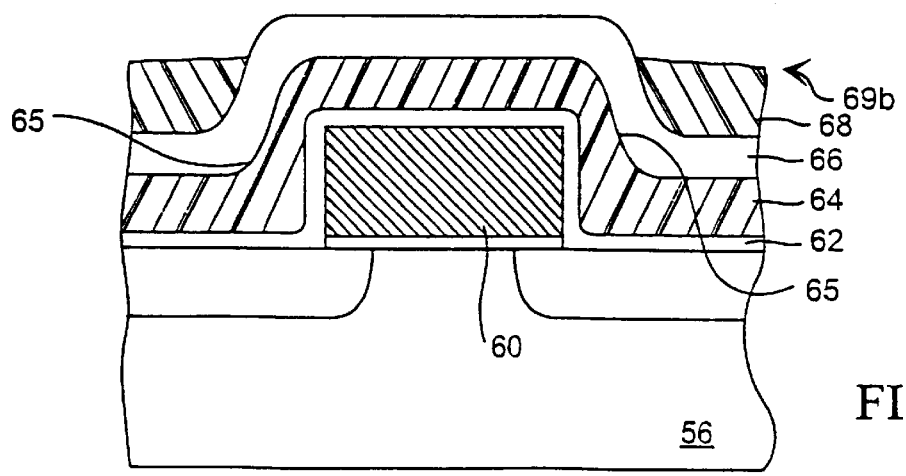

Turning now to FIG. 6, upper surface 69a (shown in FIG. 5) is etched back in a step subsequent to that of FIG. 5. Thus, a portion of SOG 68 is sacrificially etched back to present an exposed upper surface region of dielectric layer 66 substantially coplanar with exposed upper surface 69b of SOG 68. By partially etching back SOG layer 68, dielectric 68 remains only in the troughs or valleys between raised regions of layer 66.

Figure 7:
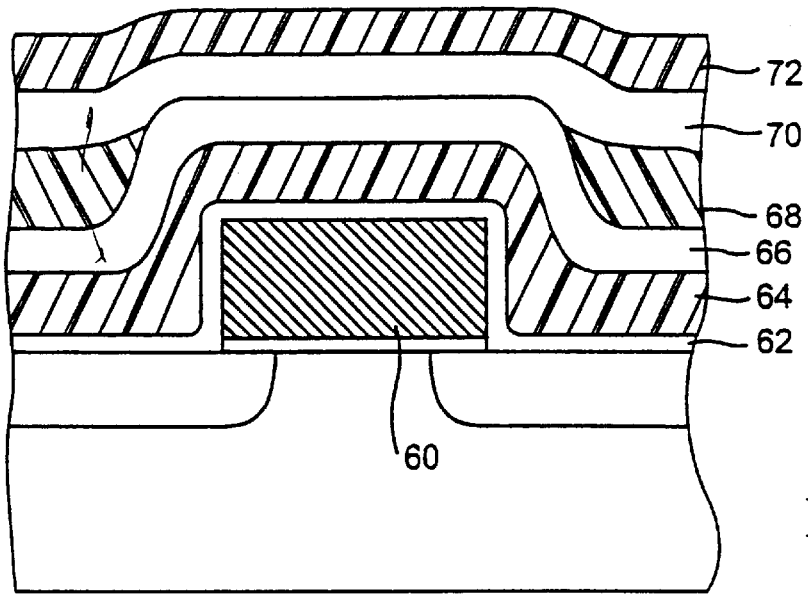

Turning now to FIG. 7, a pair of dielectrics 70 and 72 are deposited upon the exposed upper surface of dielectrics 68 and 66 in a step subsequent to that shown in FIG. 6. Specifically, FIG. 7 illustrates dielectric layer 70 formed upon layers 68 and 66, and dielectric layer 72 formed upon dielectric layer 70. Dielectric layer 70 is suitably formed as an oxide within a PECVD system under conditions similar to that used in forming the PECVD layer 66. Thus, SOG layer 68 is sandwiched between PECVD layer 66 and PECVD layer 70. Layer 72 is suitably formed as a dielectric layer which passivates the underlying semiconductor wafer topography. Thus, layer 72 is the final layer deposited upon a semiconductor layer. Layer 72 includes a passivation material chosen to present a barrier against moisture and sodium ingress from the outside environment to underlying wafer topography. Suitable passivation material includes nitride or oxynitride material. After passivation layer 72 is formed, windows are etched through the passivation layer in the regions overlying die bonding pads (not shown).

Substantial amounts of hydrogen are generally present when SOGs, nitrides or oxynitrides are formed. Thus, hydrogen occurs in the formation of the exemplary structure set forth in FIG. 7, at layers 68 and 72. If not inhibited, the hydrogen in those layers can break from their bond locations and migrate as positively charged atoms to floating conductor 60 operatively programmed with a negative potential. Measures must therefore be taken to prevent origination of hydrogen atoms from the bond locations and migration of those hydrogen atoms to negatively charged (programmed) floating gate 60.

Figure 11:
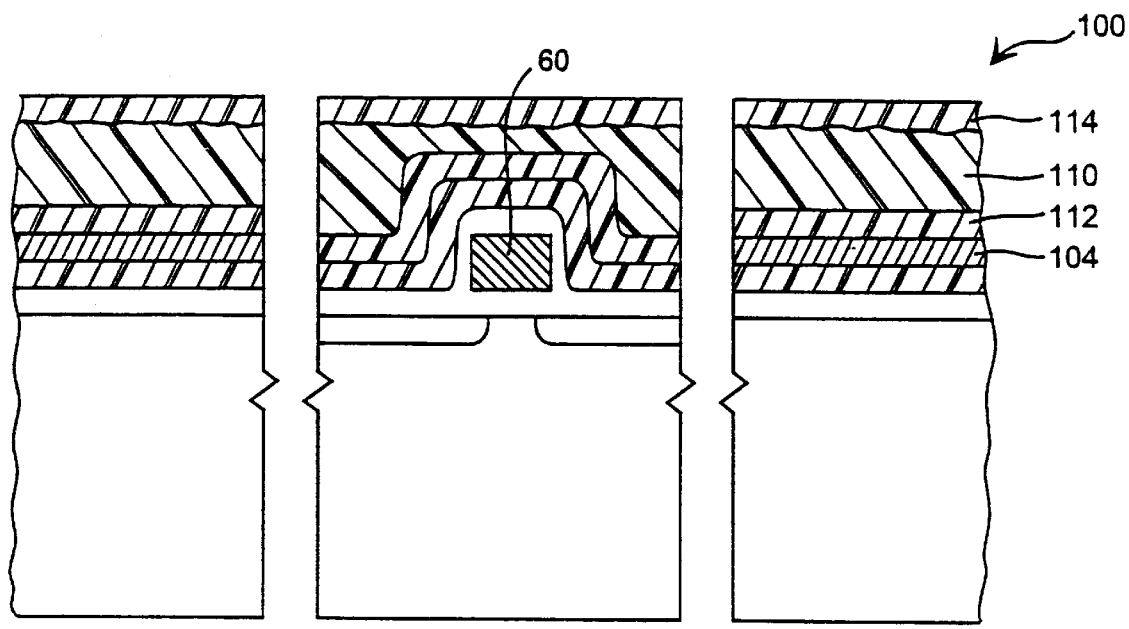
FIGS. 11 and 12 are partial, cross-sectional views of memory cells having or more metallization levels (conductors) deposited at an elevational level above a floating gate according to the present invention.
Figure 12:
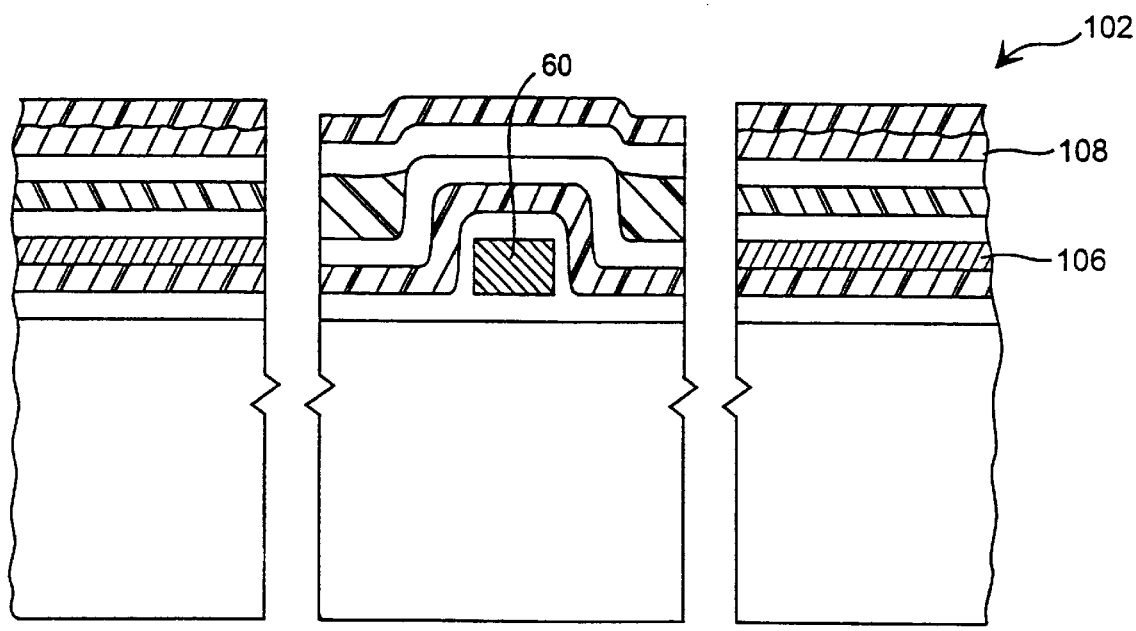

In order to prevent occurrence of free hydrogen atoms and the migration of those atoms to floating conductor, the present process utilizes a low temperature fabrication methodology. Specifically, any dielectric or conductive layer having hydrogen as a constituent in its formation is hereby formed at temperatures less than 380° C. and in some instances less than 350° C. Further, any layer (either a layer having a hydrogen constituent or one not having a hydrogen constituent) formed after the initial hydrogen-containing layer is hereby formed at a temperature less than 380° C. Accordingly, low temperature formation of critical layers is thereby used to ensure minimal disruption of certain types of hydrogen bonds within the hydrogen-bearing layers. Thus, using the examples set forth in FIG. 7, the hydrogen-containing layer such as SOG layer 68 is formed at a temperature less than 380° C., and any subsequent layers is formed thereover are fabricated at temperatures less than 380° C. The subsequently formed metal layers, the alloy temperatures and sintering temperatures necessary to activate those metal layers are performed at temperatures less than 380° C. FIG. 7 illustrates a dual level metallization scheme, wherein metallization layers (not shown in FIG. 7 but shown in FIG. 11) are formed at several levels between the floating gate and the passivation layer. FIGS. 11 and 12 described herein below are further illustrative of distinctions between a single level and a dual level metallization scheme, wherein metallization is shown. FIGS. 4–7 do not illustrate the metallization levels for sake of clarity and brevity.

THEORY AND EXPERIMENTATION

By way of explanation, and not of limitation, the following mechanism, which explains charge loss or charge neutralization upon the floating gate is presented. The charge loss is experimentally discovered as being caused primarily by the diffusion of hydrogen atoms from a hydrogen-containing source layer, such as the oxynitride passivation layer 72 and/or SOG layer 68 to a negatively charged floating gate 60. Dielectric layers 72 and 68 thereby appear as containing hydrogen. The hydrogen atoms (positively charged atoms) gain freedom during high temperature fabrication from a bond location within the dielectric layer and travel during operation of the memory device to a "programmed" negatively charged floating gate. Accumulation of positively charged hydrogen atoms upon the negatively charged floating gate neutralizes the programmed voltage upon the floating gate. A result of neutralization (or negative charge loss) is the deleterious deletion of information stored within the supposedly non-volatile PROM device.

As an aid to understanding the solution to the charge loss phenomena according to the present invention, the following equation is presented:

$$C(x,t) = C_o \mathrm{erfc}\left(\frac{x}{2\sqrt{Dt}}\right) \qquad (1)$$

, wherein C(x,t) represents the hydrogen concentration which is proportional to the distance x traveled by the hydrogen atoms from the dielectric source to the underlying floating gate 60. Time t represents the time it takes for the hydrogen atoms to travel to floating gate 60. $C_0$ is the concentration of hydrogen within the various dielectric layers; erfc is the complementary error function; and, D is the diffusion coefficient of hydrogen in the medium (intermediate dielectric layers) through which it travels.

The diffusion coefficient D of hydrogen depends upon temperature, as shown below:

$$D = D_o \exp\left[\frac{-E_a}{kT}\right] \qquad (2)$$

wherein $E_a$ is the activation energy, k is the Boltzman constant, and T is the temperature in Kelvin. The effect of temperature on the diffusion of hydrogen from the source layers to floating conductor 60 appears in direct correlation. By reducing the temperature by which various dielectric layers are formed, diffusion coefficient D of hydrogen is correspondingly lowered. Thus, reducing the temperature of layers having hydrogen therein correspondingly reduces the amount of available free atomic hydrogen and the diffusion of that hydrogen to underlying floating conductor 60.

At lower temperatures, hydrogen within the hydrogen-containing dielectrics exists in several different forms depending upon the deposition conditions of the hydrogen-containing layers. For example, hydrogen can be bonded within the hydrogen-containing layers as Si—H, N—H and/or Si—OH. The Si—H bond is broken at a temperature of approximately 250° C. or more. The N—H bond is broken at a temperature of about 400° C. or more. The Si—OH bond is broken at a temperature of approximately 700° C. or more. Accordingly, the number of hydrogen atoms available for diffusion depends upon the temperature at which the hydrogen-containing dielectric layer is formed. Formation of the hydrogen-containing layers must therefore be controlled at temperatures less than 380° C., and in some instances less than 350° C. not only for those layers, but for any subsequently formed layer. This includes the formation of dielectric layers having hydrogen or subsequently placed dielectric layers as well as subsequently placed conductive layers (i.e., metallization layers). The alloy or sintering steps used to form the metal-silicon interface must therefore be performed at temperatures less than 380° C. for all metallization formed after the deposition of the first hydrogen-containing dielectric layer (provided the hydrogen-containing layer is formed after, and spaced upon or above floating conductor 60).

Figure 3:
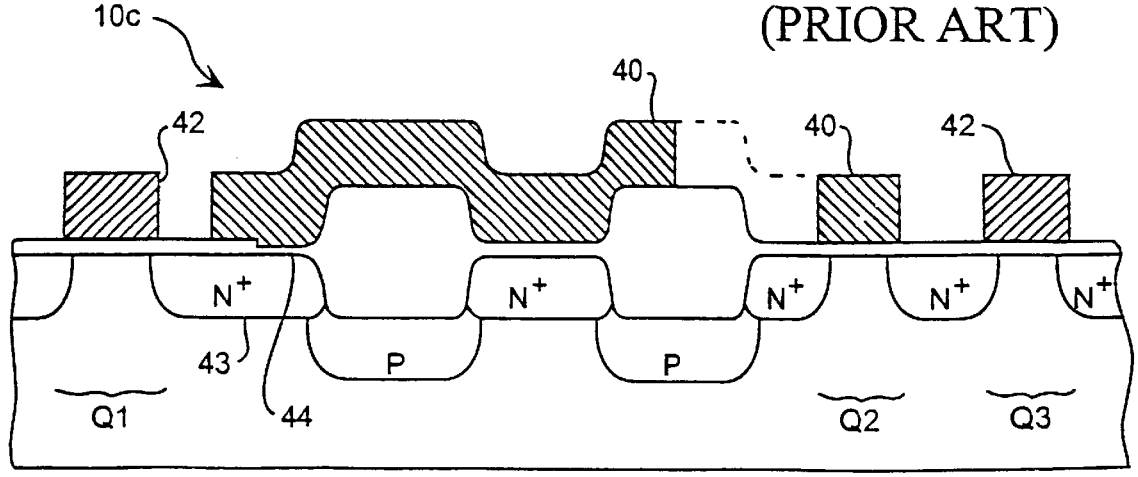
FIG. 3 is a partial, cross-sectional view of yet another conventional memory cell having a single level floating conductor laterally spaced from a control conductor.
Figure 8:
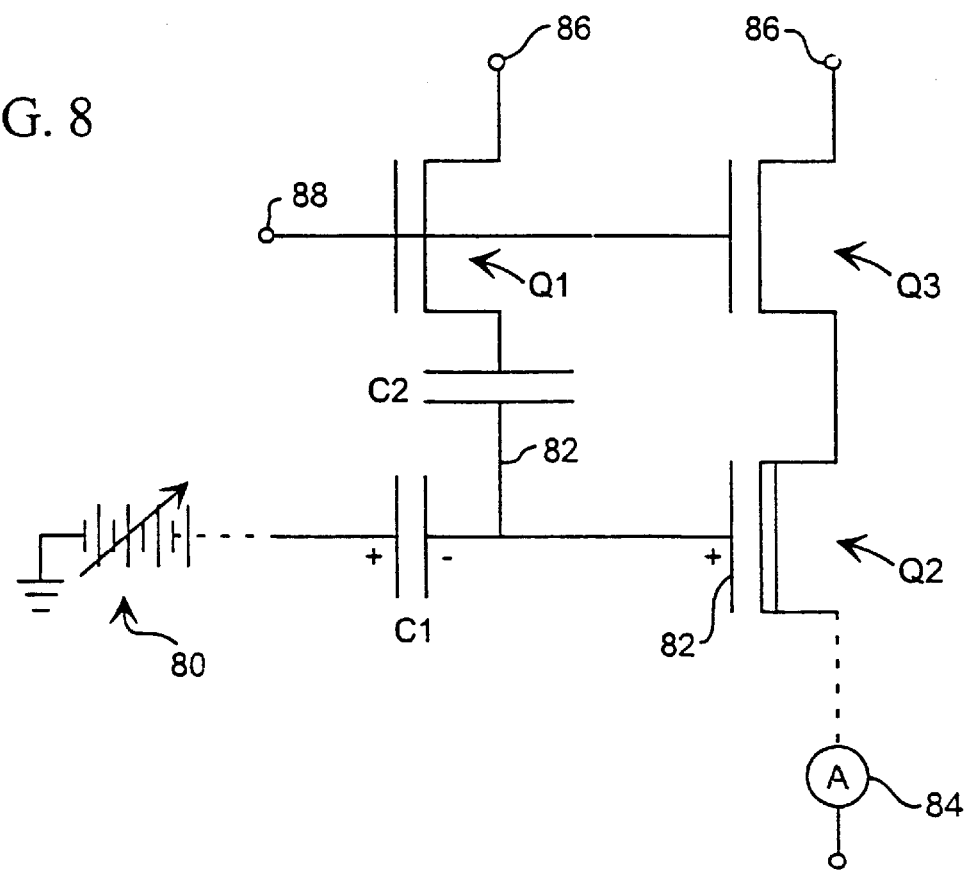
FIG. 8 is a schematic of a circuit used to test the charge retention (or charge loss) of a programmed floating gate.
Figure 9:
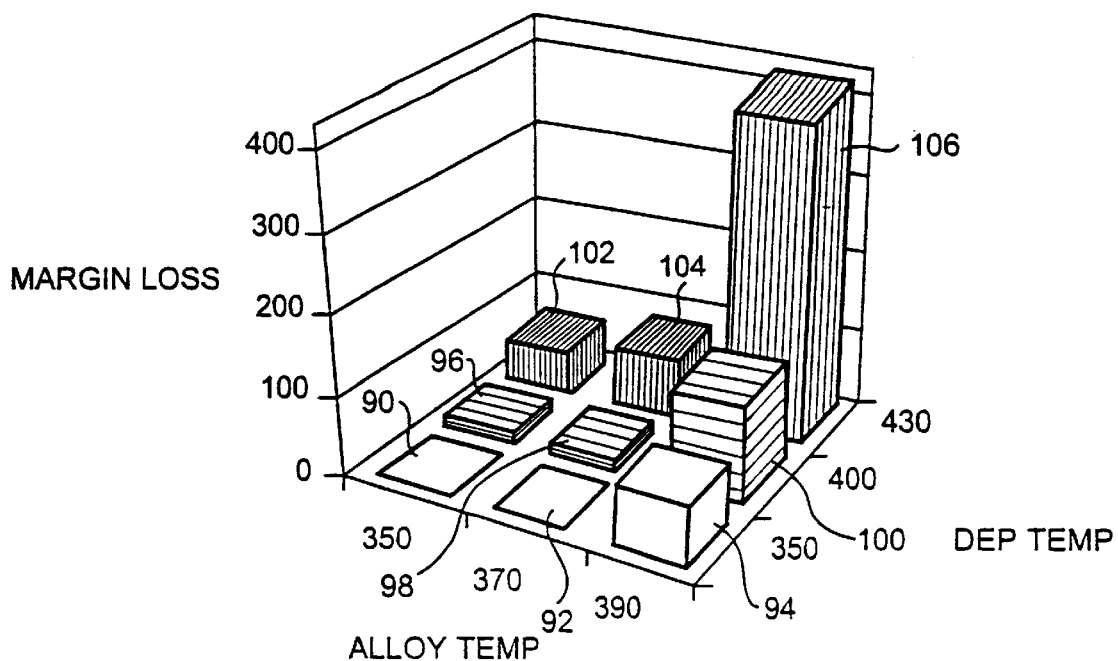
FIG. 9 is a graph of experimental results depicting failure rate derived from the test circuit of FIG. 8 and taken as a function of dielectric/conductor processing temperatures.
Figure 10:
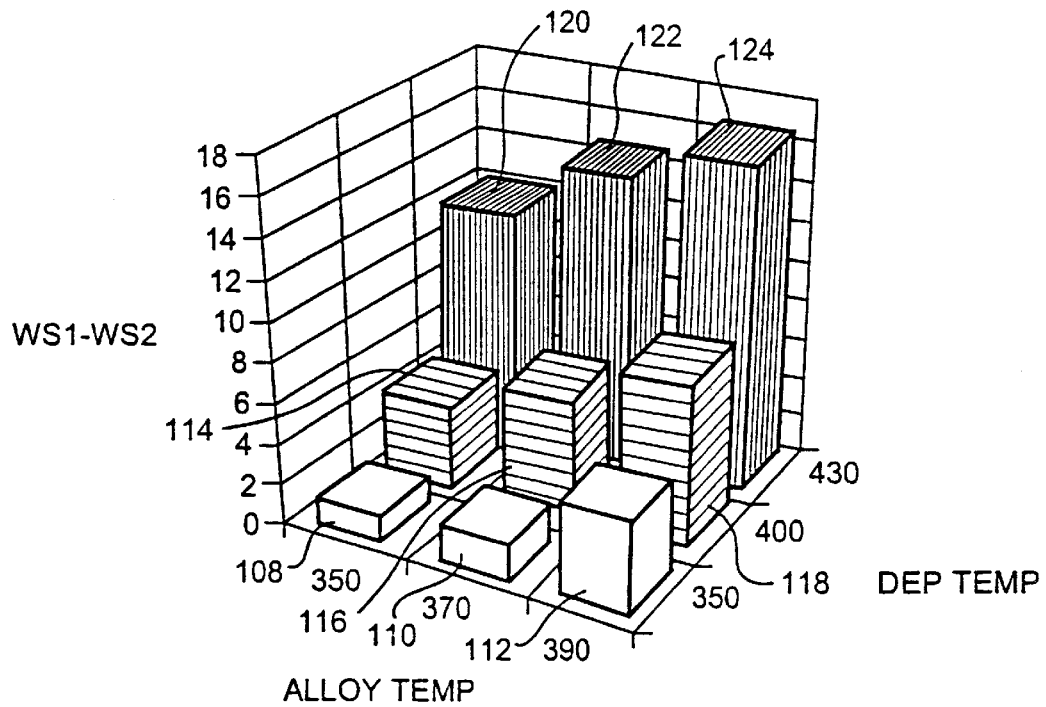
FIG. 10 is a graph of pre- and post-bake failure rates derived from the test circuit of FIG. 8 and taken as a function of dielectric/conductor processing temperatures.

The experimental tests necessary to confirm optimal processing temperatures for hydrogen-containing layers and layers subsequent thereto is set forth in reference to FIGS. 8-10. FIG. 8 illustrates a circuit schematic used to test charge retention capability of a floating gate. Specifically, FIG. 8 illustrates a circuit schematic representative of the cross-sectional topography shown in FIG. 3. A positive charge from a variable voltage source 80 is applied to capacitor C1. On the opposing plate of capacitor C1 is a corresponding negative charge buildup. The negative charge on capacitor C1 draws a positive charge upon floating gate 82 of sense transistor Q2. An increase in voltage supply 80 corresponds with an increase in positive charge upon the floating gate thereby causing charge loss or charge neutralization of a floating gate 82.

A natural result of charge neutralization is an increase in current read at ammeter 84. Thus, changes in voltage source 80, given a constant voltage at the source and gate nodes 86 and 88, respectively, of program and read transistors Q1 and Q3, respectively, will produce a corresponding change in current reading at meter 84. Capacitor C2 is illustrative of the tunnel oxide capacitance between floating conductor 82 and the drain region of program transistor Q1.

Transistors Q1 and Q3 are used to program and read logic states associated with electron accumulation upon floating gate 82. Thus, FIG. 8 illustrates an exemplary cell of a memory device. There may be numerous other configurations of a memory cells, each configuration can be measured for the quantity of electron charge loss at the floating gate resulting from voltage supplied thereto.

Using the example shown in FIG. 8, an increase in voltage value by source 80 causes at corresponding decrease in electrons upon floating gate 82. The decrease in electrons is read by meter 84. Voltage source 80 is applied via overlying dielectric layers (represented as capacitor C1) to the floating gate polysilicon (floating gate 60 of the structure shown in FIG. 7) to provide relative charge retention data associated with atomic hydrogen which might be available as a result of processing within dielectric layers overlying floating gate 60. The actual experimental results of voltage source and corresponding current readings taken from a memory device, such as one formed by the process presented in reference to FIGS. 4–7, are depicted in FIGS. 9 and 10.

FIG. 9 illustrates nine groups of wafers 90–106. Each group is processed according to different dielectric deposition temperatures and metal alloy temperatures. The groups of wafers contain hydrogen-bearing dielectrics deposited at one of three deposition temperatures ("dep temp" of 350° C., 400° C. and 430°), and also contain metallization layers alloyed at one of three alloy temperatures ("alloy temp" of 350° C., 370° C. and 390°). FIG. 9 thereby illustrates nine separate and unique deposition/alloy temperatures. To further clarify, a first group 90 contains dielectrics formed at 350° C. and metal alloyed at 350° C. A next group 92 contains dielectrics deposited at 350° C. and metal alloyed at 370° C. A third group 94 contains dielectrics deposited at 350° C. and metal alloyed at 390° C. A fourth group 96 contains dielectrics deposited at 400° C. and metal alloyed at 350° C. Changes to deposition temperature and metal alloy temperature are continued for each group, through wafer group 106.

FIG. 9 illustrates wafer grouping 106 having an average failure of approximately 420 die per wafer. Die failure is deemed as a single cell upon the die which operates outside a pre-determined margin, referred to in FIG. 9 as a "margin loss" criteria. As defined herein, "margin loss" refers to a predetermined amount of charge loss upon the floating gate as a relative proportion to the original charge thereon. Margin loss thereby represents a loss in charge as measured by meter 84 in FIG. 8 caused by a corresponding increase in voltage source 80. For example, a pre-determined margin might be 20 percent. Using this example, if greater than 20 percent of the electrons are neutralized or move from the floating gate as a result of increase in voltage 80 as measured by more than 20 percent increase in current at meter 84, then a die having a memory cell experiencing such a loss is deemed a failed die. Thus, voltage 80 is increased uniformly for each cell of each die, any current read by meter 84 which exceeds a predetermined amount (e.g., 20 percent) will correspond to charge loss beyond margin, and will therefore be defined as a failed die. FIG. 9 illustrates a preponderance of failed die, approximately 420, whenever the hydrogen-bearing dielectric, and subsequent dielectrics are formed at fabrication temperatures approximating 430° C. and where metallization layers, during wafer fabrication, are alloyed at temperatures approximating 390° C. As alloy temperature decreases, as shown by groupings 104 and 102, defective die outside the margin loss criteria decrease under correspondingly similar dielectric deposition temperatures. A decrease in dielectric deposition temperature and decrease in alloy temperature causes a lessening in charge loss as evidenced by grouping 90 of minimum wafer fabrication temperature.

Referring now to FIG. 10, wafer groupings 108–124 are shown. A similar matrix of dielectric deposition temperature and metal alloy temperature similar to that of FIG. 9 is illustrated. The tests results presented in FIG. 10 are, however, dissimilar to those of FIG. 9. Instead Kilo of measuring defective die falling outside a predetermined margin of charge loss, FIG. 10 illustrates a first wafer sort (WS1) and a second wafer sort (WS2), wherein the defective die discovered within the second wafer sort is taken relative to defective die within the first wafer sort. Wafer sort is defined herein as the test procedure in which die are tested according to the test circuit set forth in FIG. 8, and die are deemed "failed" upon detection of charge loss outside a pre-determined margin set forth above. Similar to the test procedure used in FIG. 9, FIG. 10 testing is begun at a first wafer sort operation, after the memory cell array is fabricated and floating gates are programmed. Testing is performed using the device of FIG. 8 to present a margin loss at the first wafer sort step. Thereafter, the wafer is heated, or "baked" at a temperature of approximately 250° C., and another wafer sort (WS2) operation is undertaken. Using the first wafer sort set at a benchmark of 100 percent good die, a second wafer sort is shown in FIG. 10 relative to the first wafer sort. Thus, wafer grouping 124 illustrates approximately 16 die which failed the second wafer sort and which did not fail the first wafer sort. It is postulated that the combination of negative charge upon the floating gate and baking exacerbates migration of hydrogen from the overlying dielectrics to the underlying floating gate. As evidenced by grouping 124, this problem, however, presents itself primarily when the hydrogen-bearing dielectrics and subsequently placed dielectrics are deposited at a high temperature of approximately 430° C., and the metallization layers are alloyed at a high temperature of approximately 390° C. Whenever lower temperature depositions and alloys occur, a lessening of charge loss is presented at the second wafer sort step relative to the first wafer sort step. In fact, grouping 108 indicates only one wafer failure during WS2 relative to WS1. It is illustrated in FIG. 10, as well as FIG. 9, that lower temperature processing is primarily responsible for lower defect densities.

Turning now to FIGS. 11 and 12, partial, cross-sectional views of a memory cell 100 and 102, respectively are shown. Memory cell 100 includes a single level of metallization 104. Conversely, FIG. 12 illustrates two metallization levels 106 and 108. Device 102 is shown having a plurality of dielectrics, including floating conductor 60 similar to the configuration of FIG. 7. FIG. 12 is presented to illustrate metallization layers interspersed between the dielectric layers, as the dielectric layers are formed upon floating conductor 60. The metallization layers can extend over floating conductor 60, but are shown in FIG. 12 laterally spaced from floating conductor 60. FIG. 11 illustrates a single level of metallization 104 interspersed between dielectrics. The dielectrics in FIG. 11 are formed slightly dissimilar from those shown in FIG. 7. In particular, FIG. 11 illustrates a non-sacrificial SOG layer 110 sandwiched between a pair of oxynitride layers 112 and 114. It is understood that dielectric layers can be arranged in any workable configuration and, regardless of that configuration, metallization layers (one or more), can be formed between pairs of those dielectrics. Thus, not only must the overlying dielectrics be carefully controlled during the deposition cycle, but alloy and sintering of metal conductive layers must also be controlled so as to achieve an optimal, overall processing temperature.

It will be appreciated by those skilled in the art having the benefit of this disclosure that this invention is believed to be capable of applications with numerous types of non-volatile memory devices including, but not limited to EPROM, flash EPROM and/or EEPROM devices. Furthermore, it is also to be understood that the invention shown and described is to be taken as presently preferred embodiment. Various modifications and changes may be made to each and every processing as would be obvious to a person skilled in the art without departing from the spirit and scope of the invention as set forth in the claims. It is intended that the following claims be interpreted to embrace all such modifications and changes, and accordingly, the specification and drawings are to be regarded in an illustrative rather than a restrictive sense.

What is claimed is:

1. A non-volatile memory cell, comprising:
   a semiconductor substrate containing impurity implant regions and a tunnel oxide placed upon said substrate;
   a polysilicon strip placed upon said tunnel oxide, wherein said polysilicon strip is adapted to receive electrons injected during a program cycle of said memory cell from one of said impurity implant regions; and
   a dielectric comprising hydrogen formed above said polysilicon strip from a chamber comprising hydrogen, wherein said dielectric is formed within said chamber at a temperature less than 380° C. to minimize formation and movement of free atomic hydrogen from said dielectric to said polysilicon strip at a time in which said polysilicon strip receives said electrons.

2. The memory cell as recited in claim 1, wherein said dielectric formed at a temperature less than 380° C. comprises a greater number of Si—OH bonds than Si—H bonds.

3. The memory cell as recited in claim 2, wherein said Si—OH bonds remain in a bonded position at temperatures less than 400° C.

4. The memory cell as recited in claim 2, wherein said Si—H bonds remain in a bonded position at temperatures less than 250° C.

5. The memory cell as recited in claim 1, wherein said hydrogen-containing layer is a layer of oxide, spin on glass (SOG), or borophosphosilicate glass (BPSG).

6. The memory cell as recited in claim 1, further comprising a combination of dielectric and conductive layers formed upon said hydrogen-containing dielectric at a temperature less than 380° C., wherein the uppermost layer of said combination of dielectric and conductor levels comprises a passivation layer.

7. The memory cell as recited in claim 6, wherein said passivation layer comprises a material selected from the group consisting of oxynitride, nitride and oxide.

8. The memory cell as recited in claim 1, wherein said polysilicon strip is a floating conductor, and wherein said dielectric is arranged upon said floating conductor.

9. The memory cell of claim 8 further comprising a control conductor spaced above said floating conductor and another dielectric formed at a temperature less than 380° C. above said control conductor.

* * * * *